US012388019B2

(12) United States Patent
Collins et al.

(10) Patent No.: US 12,388,019 B2
(45) Date of Patent: *Aug. 12, 2025

(54) PITCH TRANSLATION ARCHITECTURE FOR SEMICONDUCTOR PACKAGE INCLUDING EMBEDDED INTERCONNECT BRIDGE

(71) Applicant: Intel Corporation, Santa Clara, CA (US)

(72) Inventors: Andrew Collins, Chandler, AZ (US); Bharat P. Penmecha, Phoenix, AZ (US); Rajasekaran Swaminathan, Chandler, AZ (US); Ram Viswanath, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/750,571

(22) Filed: Jun. 21, 2024

(65) Prior Publication Data

US 2024/0347457 A1    Oct. 17, 2024

Related U.S. Application Data

(63) Continuation of application No. 18/199,735, filed on May 19, 2023, now Pat. No. 12,051,647, which is a (Continued)

(51) Int. Cl.
*H01L 23/528* (2006.01)
*H01L 23/00* (2006.01)
(Continued)

(52) U.S. Cl.
CPC .... *H01L 23/5283* (2013.01); *H01L 23/49838* (2013.01); *H01L 23/5381* (2013.01);
(Continued)

(58) Field of Classification Search
CPC ................................................. H01L 23/5283
See application file for complete search history.

(56) References Cited

U.S. PATENT DOCUMENTS 11,270,942 B2    3/2022  Collins
11,705,398 B2    7/2023  Collins
(Continued)

OTHER PUBLICATIONS

Office Action from European Patent Application No. 18208998.7 mailed Feb. 9, 2021, 3 pgs.
(Continued)

*Primary Examiner* — Douglas M Menz
(74) *Attorney, Agent, or Firm* — Schwabe, Williamson & Wyatt P.C.

(57) ABSTRACT

Various embodiments relate to a semiconductor package. The semiconductor package includes a first die. The first die includes a first bridge interconnect region. The semiconductor package further includes a second die. The second die includes a second bridge interconnect region. The semiconductor package includes a bridge die. The bridge die includes a first contact area to connect to the first bridge interconnect region and a second contact area to connect to the second bridge interconnect region. In the semiconductor package, the first bridge interconnect region is larger than the second bridge interconnect region. Additionally, each of the first bridge interconnect region and the second bridge interconnect region include a plurality of conductive bumps. An average pitch between adjacent bumps of the first bridge interconnect region is larger than an average pitch between adjacent bumps of the second bridge interconnect region.

20 Claims, 4 Drawing Sheets

Related U.S. Application Data continuation of application No. 17/585,082, filed on Jan. 26, 2022, now Pat. No. 11,705,398, which is a continuation of application No. 16/839,393, filed on Apr. 3, 2020, now Pat. No. 11,270,942, which is a continuation of application No. 15/857,515, filed on Dec. 28, 2017, now Pat. No. 10,643,945.

(51) Int. Cl.
*H01L 23/498* (2006.01)
*H01L 23/538* (2006.01)
*H01L 25/065* (2023.01)
*H01L 25/18* (2023.01)

(52) U.S. Cl.
CPC ...... *H01L 23/5383* (2013.01); *H01L 23/5384* (2013.01); *H01L 23/5385* (2013.01); *H01L 24/17* (2013.01); *H01L 24/23* (2013.01); *H01L 25/0655* (2013.01); *H01L 25/18* (2013.01)

(56) References Cited

U.S. PATENT DOCUMENTS

| | | | |
|---|---|---|---|
| 12,051,647 B2 * | 7/2024 | Collins | ............ H01L 24/23 |
| 2010/0327424 A1 | 12/2010 | Braunisch | |
| 2014/0264791 A1 | 9/2014 | Manusharow et al. | |
| 2016/0302308 A1 | 10/2016 | Lee et al. | |
| 2017/0092621 A1 | 3/2017 | Das | |

OTHER PUBLICATIONS

Extended European Search Report for European Patent Application No. 18208998.7 mailed Apr. 30, 2019, 7 pgs.

\* cited by examiner

PITCH TRANSLATION ARCHITECTURE FOR SEMICONDUCTOR PACKAGE INCLUDING EMBEDDED INTERCONNECT BRIDGE

CROSS-REFERENCE TO RELATED APPLICATIONS

This application is a continuation of U.S. patent application Ser. No. 18/199,735, filed May 19, 2023, which is a continuation of U.S. patent application Ser. No. 17/585,082, filed Jan. 26, 2022, now U.S. Pat. No. 11,705,398, issued Jul. 18, 2023, which is a continuation of U.S. patent application Ser. No. 16/839,393, filed Apr. 3, 2020, now U.S. Pat. No. 11,270,942, issued Mar. 8, 2022, which is a continuation of U.S. patent application Ser. No. 15/857,515, filed on Dec. 28, 2017, now U.S. Pat. No. 10,643,945, issued May 5, 2020, the entire contents of which are hereby incorporated by reference herein.

BACKGROUND

High bandwidth interconnects on a package are becoming relevant in high performance computing. The embedded multi-die interconnect bridge (EMIB), pioneered and developed by Intel®, is a device that addresses this and facilitates a lower cost and simpler 2.5D packaging approach for very high density interconnects between heterogeneous dies on a single package. Instead of an expensive silicon interposer, which must enclose the entire die complex and utilize "through silicon vias" (TSV) for all top die to package connections, a typical EMIB comprises a small silicon bridge chip that is embedded in the package substrate, enabling very high density die-to-die connections only where needed, such as with fine line and spaced (FLS) traces.

BRIEF DESCRIPTION OF THE FIGURES

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

DETAILED DESCRIPTION OF THE DISCLOSURE

Reference will now be made in detail to certain embodiments of the disclosed subject matter, examples of which are illustrated in part in the accompanying drawings. While the disclosed subject matter will be described in conjunction with the enumerated claims, it will be understood that the exemplified subject matter is not intended to limit the claims to the disclosed subject matter.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section.

In the methods described herein, the acts may be carried out in any order without departing from the principles of the disclosure, except when a temporal or operational sequence is explicitly recited. Furthermore, specified acts may be carried out concurrently unless explicit claim language recites that they be carried out separately. For example, a claimed act of doing X and a claimed act of doing Y may be conducted simultaneously within a single operation, and the resulting process will fall within the literal scope of the claimed process.

The term "about", as used herein, may allow for a degree of variability in a value or range, for example, within 10%, within 5%, or within 1% of a stated value or of a stated limit of a range, and includes the exact stated value or range.

The term "substantially", as used herein, refers to a majority of, or mostly, as in at least about 50%, 60%, 70%, 80%, 90%, 95%, 96%, 97%, 98%, 99%, 99.5%, 99.9%, 99.99%, or at least about 99.999% or more, or 100%.

Figure 1:
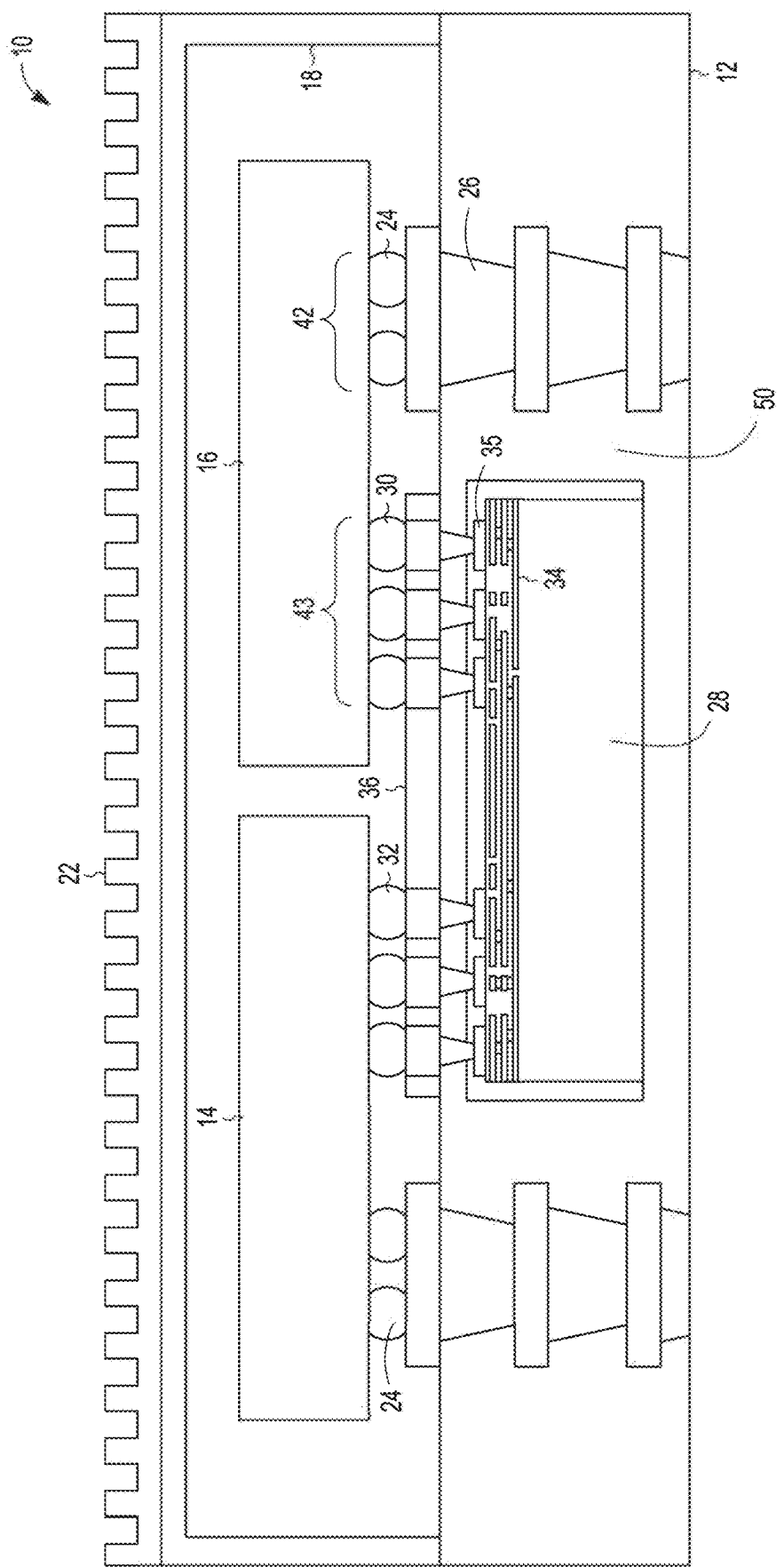
FIG. 1 is a cross-sectional diagram of a semiconductor package using an embedded interconnect bridge (EMIB™) architecture, in accordance with various embodiments.

FIG. 1 is a cross-sectional diagram of a semiconductor package using an Embedded Multi-die Interconnect Bridge (EMIB™) architecture. In one example, package 10 is formed from substrate 12 that exhibits a at least partially embedded bridge die 28, which serves as a communication pathway for the surface first and second dies 14 and 16. First and second dies 14 and 16 can be top-mounted active or passive dies. Embedded bridge die 28 can be an active die or a passive die. Cover 18 covers substrate 12 and dies 14 and 16. Cooling solution 22 such as cooling fins, as shown in this example, are attached to the top of cover 18. A variety of different cooling solutions 22 may be used such as conductive plates, integrated heat spreaders, liquid cooling, heat pipes, or radiative fins as shown depending on the particular embodiment. Alternatively, the device may be fabricated without the cooling solution 22 and even without cover 18.

Device substrate 12 may include internal low density interconnect routing for communicating between surface dies 14 and 16. Substrate 12 includes embedded components of a semiconductor material (e.g., a silicon, gallium, indium, germanium, or variations or combinations thereof) and one or more insulating layers, such as organic based build up film, glass-reinforced epoxy, such as FR-4, polytetrafluor-ethylene (Teflon), cotton-paper reinforced epoxy (CEM-3), phenolic-glass (G3), paper-phenolic (FR-1 or FR-2), poly-ester-glass (CEM-5), or any other dielectric layer, that may be used in printed circuit boards (PCBs). Substrate 12 may be made using a bumpless buildup layer process (BBUL) or other technique. A BBUL process includes one or more build-up layers formed around an element, such as a high density interconnect element or bridge die 28 or die 14, 16. A micro via formation process, such as laser drilling, may form connections between build-up layers and die bond pads. The build-up layers may be formed using a high-density integration patterning technology.

Dies 14 and 16 may be many types of dies. In one example, die 14 may be a memory die and die 16 may be a central processing unit (CPU) die. Other examples of dies may include a Wi-Fi transmitter and a global positioning system. In some examples, both dies may be the same or different. Other examples may include more than two dies. Dies 14 and 16 are coupled through C4 bumps 24 and vias 26 to a power source outside the device (not shown). While only one pair of C4 bumps 24 is shown for each die, 14, 16 coupled to a single via 26, there may be many connection points for each die 14, 16 coupled through many vias 26 to connect the dies 14, 16 with the device and to external circuitry. The overall package 10 may be connected directly to a printed circuit board (PCB) or coupled to a socket that is attached to some other device such as another (PCB).

Dies 14 and 16 may include low density interconnect pads 39 and 42, such as may be used for power, ground, or other electrical coupling. Low density interconnect pad 42 may be electrically coupled, such as through low density interconnect element 26, to a bus (not shown) such as a power, ground, or data bus. The low density interconnect pad 42 may also be electrically coupled to an electrically conductive pad, such as through conductive adhesive (not shown). The conductive adhesive may be solder (e.g., solder paste), electroplating, or microball, such as a microball configured for flip device interconnect (e.g., controlled collapse device connection (C4) interconnect).

Embedded within the substrate 12 is bridge die 28 also known as an interconnect bridge. Bridge die 28 is made of silicon and has a silica surface. Bridge die 28 connects to CPU die 16 and memory die 14 through bumps or solder balls 30 and 32. Interconnect layers 34 within the bridge make connections between the pins or lands on each die to pins or lands on the other die 14, 16. In this way, the CPU and memory may communicate data and control information within the package 10.

In one example, as shown in FIG. 1, CPU die 16 has a first bridge interconnect area 41, including bumps 32 closest to memory die 14 for connecting through the embedded bridge die 28 to memory die 14. CPU die 16 has second bridge interconnect area 43, including bumps 30, for connecting with bridge vias. Bumps 30 and 32 may include any conductive metal such as copper, gold, silver, aluminum, zinc, nickel, brass, bronze, iron, etc.

Bridge die 28 includes electrically conductive pads at least partially on or in a top surface of bridge die 28. The electrically conductive pads may include conductive metal, such as copper, gold, silver, aluminum, zinc, nickel, brass, bronze, iron, etc. Bridge die 28 includes contact region 40 and contact region 49, which connect vias 30 and 32, respectively.

In addition, power rail 36 above bridge pad layer 35 receives power from outside the device through separate power vias (not shown) and provides this power to memory die 14 and CPU die 16. Power rail 36 may be formed of metal layers deposited over the substrate 12.

In one example, dielectric layer 50 may be formed over bridge die 28 and substrate 12. Dielectric layer 50 allows for dimensional variations in the placement and embedding of the bridge and electrically isolates all of the interconnection areas. Dielectric layer 50 may be formed from an epoxy-based resin such as bisphenol A, epoxy resin, a bisphenol F epoxy resin, a novolac epoxy resin, an aliphatic epoxy resin, a glycidylamine epoxy resin, and a glycidylamine epoxy resin, or any other resin including one or more terminal epoxy groups. In some embodiments, dielectric layer 50 includes one layer having a thickness ranging from about 5 microns to about 50 microns or about 15 microns to 45 microns, or from 20 microns to 35 microns or about 30, or less than, equal to, or greater than about 15 microns, 20 microns, 25 microns, 30 microns, 35 microns, 40, microns, or 45 microns.

In some examples of package 10, first die 14 and second die 16 may differ in size with respect to one another. For example, first die 14 and second die 16 may differ by at least one of volume or surface area. In these examples, it may be desirable to have a heterogenous distribution of bumps 30 and 32 with respect to each other. By heterogenous it is meant that an average pitch between adjacent bumps 30 is different than an average pitch between adjacent bumps 32. The heterogenous distribution of bumps may be a result of a different size by surface area of first bridge interconnect area 41 and second bridge interconnect area 43.

Figure 2:
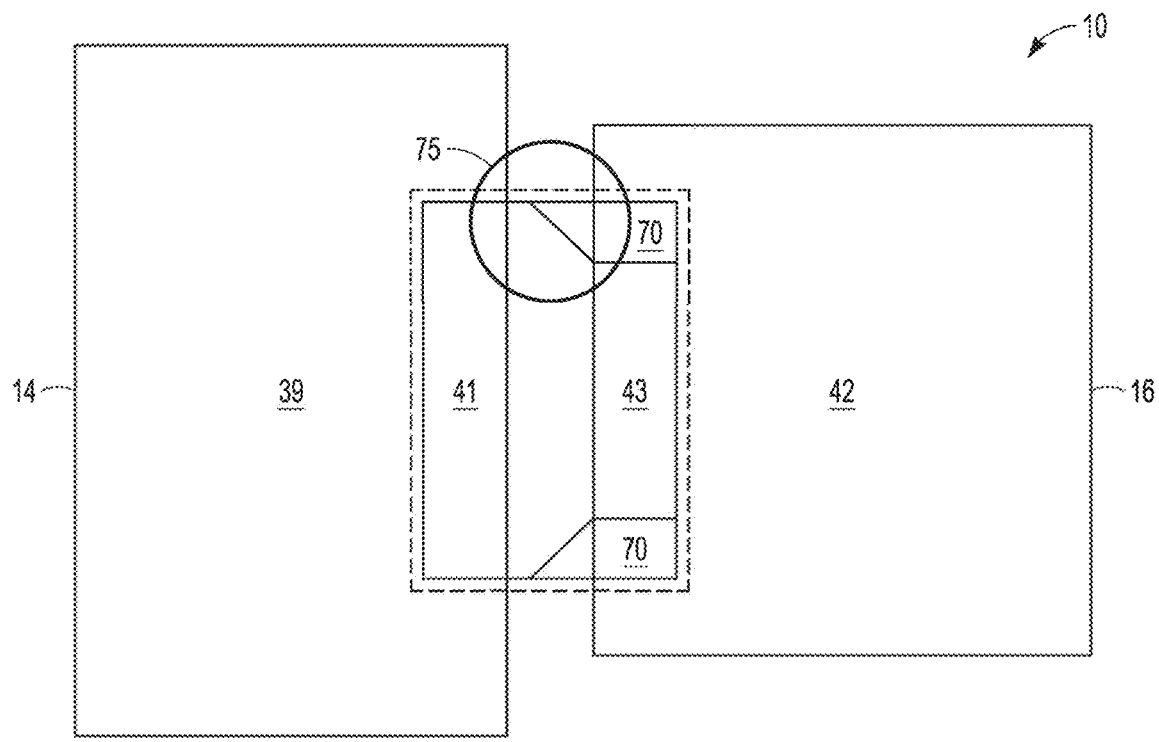
FIG. 2 is a schematic top view of an embodiment of a package, in accordance with various embodiments.

FIG. 2 is a schematic top view of an embodiment of package 10 showing first die 14 including both first bridge interconnect region 41 and interconnect pad 39; second die 16 including interconnect pad 42, second bridge interconnect region 43, and breakout regions 70; and bridge die 28 (shown in outline). Individual bumps are not shown.

First bridge interconnect region 41 may be in a range for from about 10 times to about 2 times larger than the second bridge interconnect region 43, about 5 times to about 3 times larger, or less than, equal to, or greater than about 2 times, 2.5, 3, 3.5, 4, 4.5, 5, 5.5, 6, 6.5, 7, 7.5, 8, 8.5, 9, 9.5, or about 10 times larger than second bridge interconnect region 43. To translate signal between dies 14 and 16 through bridge die 28, bumps 30 are condensed by way of reducing the average pitch there between with respect to the average pitch between bumps 32. For example, an average pitch between bumps 32 of first bridge interconnect region 41 may be in a range of from about 10 times to about 0.25 times greater than the average pitch between adjacent bumps 30 of second bridge interconnect region 43 about 2 times to about 0.5 times greater, or less than, equal to, or greater than about 0.25 times, 0.5, 1, 1.5, 2, 2.5, 3, 3.5, 4, 4.5, 5, 5.5, 6, 6.5, 7, 7.5, 8, 8.5, 9, 9.5, or about 10 times greater. As examples, the average pitch between bumps 32 of region 41 may be in a range of from about 75 microns to about 150 microns, about 75 microns to about 130 microns, or less than, equal to, or greater than about 75 microns, 80, 85, 90, 95, 100, 105, 110, 115, 120, 125, 130, 135, 140, 145, or 150 microns. As a further example, the average pitch between bumps 30 of region 43, may be in a range of from about 20 microns to about 70 microns, about 30 microns to about 65 microns, or less than, equal to, or greater than about 20 microns, 25, 30, 35, 40, 45, 50, 55, 60, 65, or about 70 microns.

Breakout regions 70 are immediately adjacent to second bridge interconnect region 43, and at least partially circumscribed by bridge die 28. Breakout regions 70 include a plurality of conductive bumps located on an external surface of die 16. Relative to bumps 30, a pitch between the adjacent bumps 24 of breakout regions 70 may be in a range of from about 10 times to about 0.5 times larger than the pitch of adjacent bumps 30 of region 43, about 5 times to about 2 times larger, or less than, equal to, or greater than about 0.5, 1, 1.5, 2, 2.5, 3, 3.5, 4, 4.5, 5, 5.5, 6, 6.5, 7, 7.5, 8, 8.5, 9, 9.5, or about 10 times larger.

Breakout regions 70 may allow for the routing of signals from die 16 through bridge die 28. The ability to form breakout regions 70 is made possible, in part, by reducing the size of second interconnect region 43 relative to first interconnect region 41. That is, the space available on second die 16 outside of second interconnect region 43, but in contact with bridge die 28, is available for the bumps 24 of breakout region 70.

Figure 3:
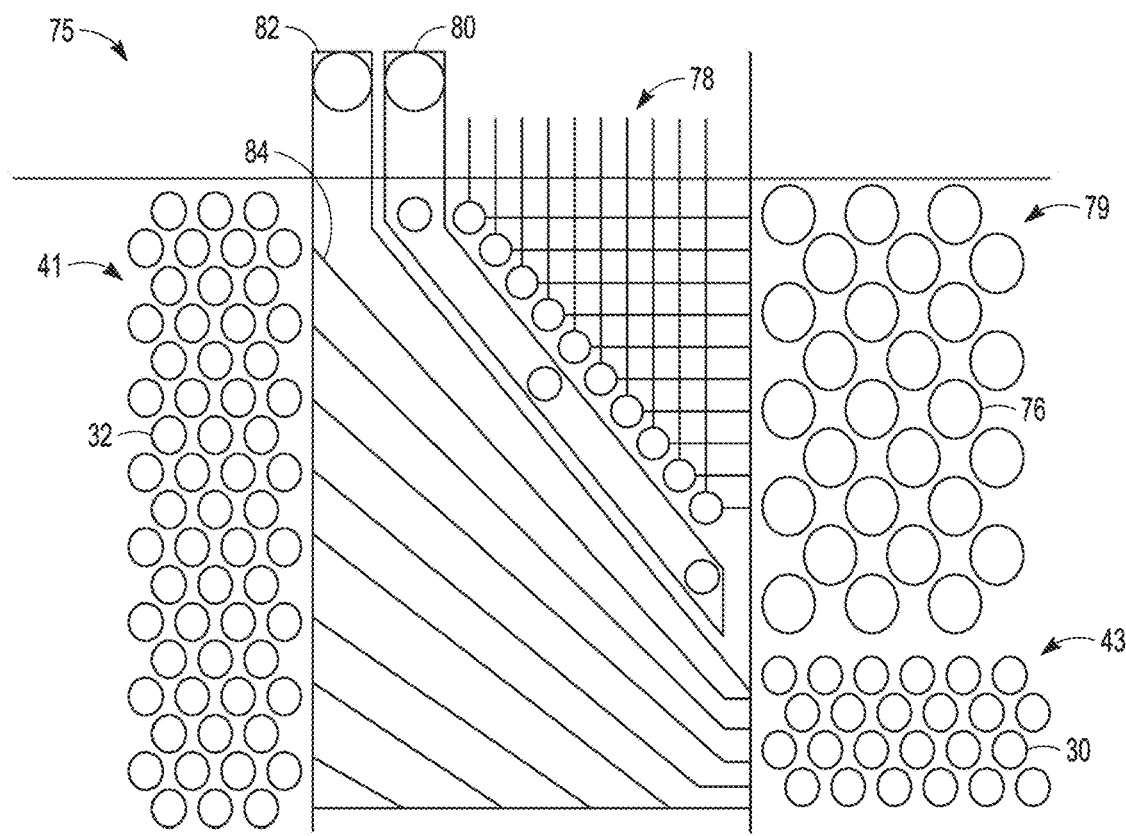
FIG. 3 is a schematic view of a section of the package of FIG. 2, in accordance with various embodiments.
Figure 4:
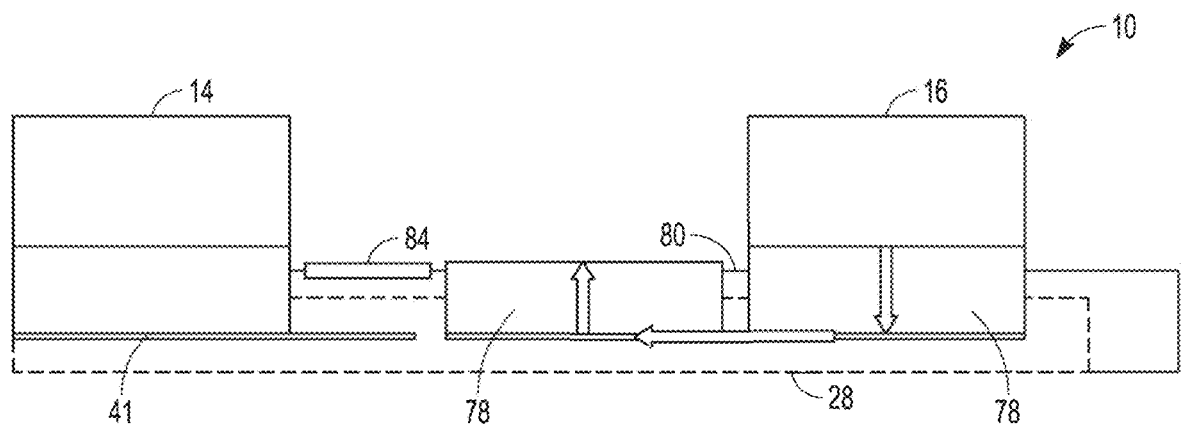
FIG. 4 is a side view of the section of the package of FIG. 3, in accordance with various embodiments.

FIG. 3 is a schematic view of section 75 of package 10 taken from FIG. 2. FIG. 3 is a top view showing first interconnect region 41 including bumps 32; second interconnect region 43 including bumps 30, breakout region 70 including bumps 76. FIG. 3 further shows components of bridge die 28 including input/outputs 78 connected to bumps 76 and exposed on a surface of bridge die 28. Bridge die 28 further includes VSS 80, VCC 82, and input outputs 84 connecting bumps 30 and 32. FIG. 4 is a side view of package 10 taken from FIG. 3 showing the path of input/outputs 78.

Figure 5:
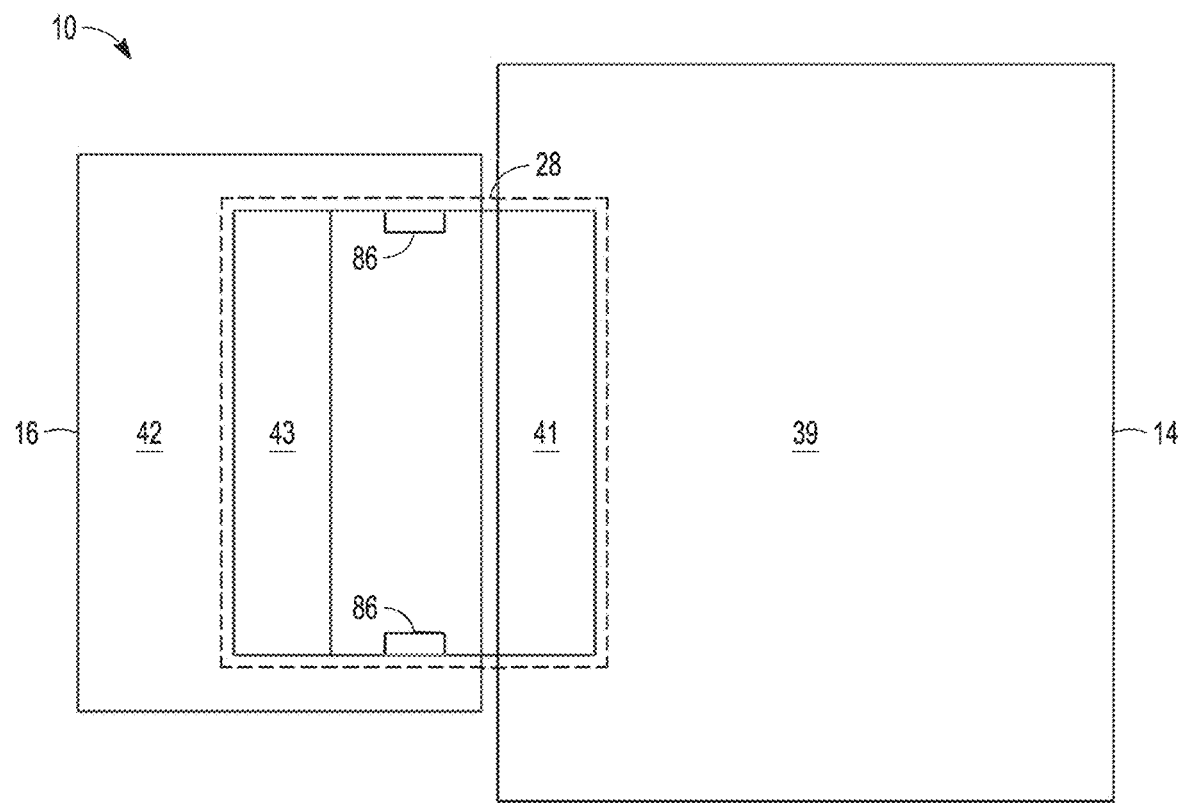
FIG. 5 is a schematic top view of another embodiment of the package including bump on a bridge die, in accordance with various embodiments.

FIG. 5 is a schematic top view of another example package 10. Package 10 may include many of the same features as the example of package 10 shown and described with respect to FIGS. 1-4. In addition to, or in place of those features, bridge die 28 may include a plurality of bumps 86 located between dies 14 and 16. Bumps 86 may be attached to input/outputs to send or receive a signal directly between bridge die 28 and any other component.

Package 10 may be manufactured according to any suitable method. For example, bumps 30, 32, and 76 may be formed on respective interconnect regions 41, 43, and breakout regions 70 by depositing a conductive metallic precursor thereon. As an example, the precursor may include electrolytic copper. The electrolytic copper may be deposited as a liquid and electroplated thereon. The bumps may be formed directly on vias of any one of dies 14, 16, or 28. Bumps 30, 32, and 76 may be connected to a via or transmission line through soldering the respective bump and transmission line or via.

Figure 6:
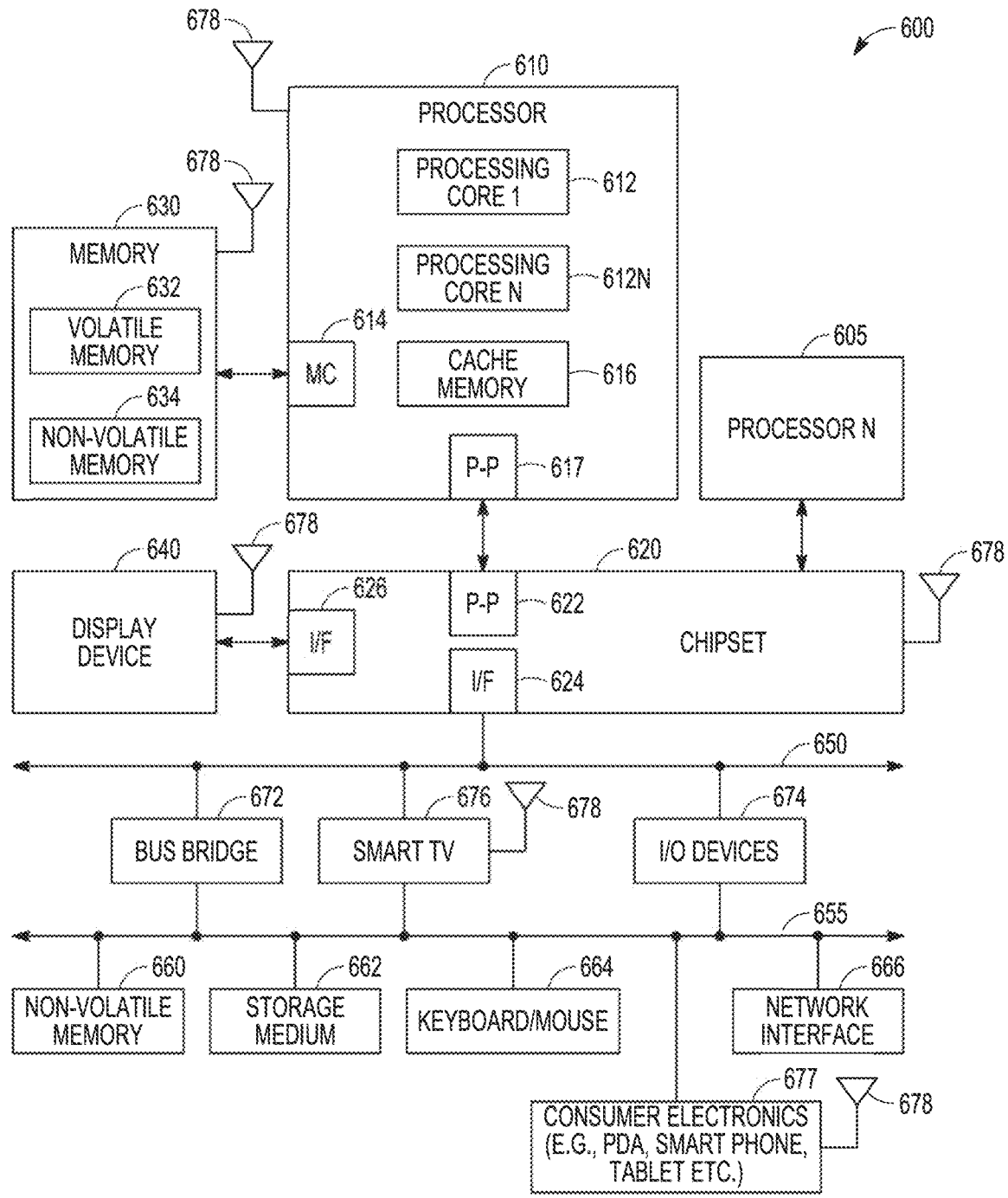
FIG. 6 is block diagram of an electronic system, in accordance with various embodiments.

FIG. 6 illustrates a system level diagram, according to an embodiment of the invention. For instance, FIG. 6 depicts an example of an electronic device (e.g., system) including package 10; FIG. 6 is included to show an example of a higher level device application for the present subject matter. In an embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 is a system on a chip (SOC) system.

In an embodiment, processor 610 has one or more processing cores 612 and 612N, where 612N represents the Nth processor core inside processor 610 where N is a positive integer. In an embodiment, system 600 includes multiple processors including 610 and 605, where processor 605 has logic similar or identical to the logic of processor 610. In some embodiments, processor core 612 includes, but is not limited to, pre-fetch logic to fetch instructions, decode logic to decode the instructions, execution logic to execute instructions, and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In an embodiment, the wireless antenna 678 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 632 includes, but is not limited to, synchronous dynamic random access memory (SDRAM), dynamic random access memory (DRAM), RAMBUS dynamic random access memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In an embodiment, memory 630 may also store temporary variables or other intermediate information while processor 610 is executing instructions. In the illustrated embodiment, chipset 620 connects with processor 610 via point-to-point (PtP or P-P) interfaces 617 and 622. Chipset 620 enables processor 610 to connect to other elements in system 600. In some embodiments of the invention, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices 672, 676, 674, 660, 662, 664, 666, 677, etc. Chipset 620 may also be coupled to a wireless antenna 678 to communicate with any device configured to transmit and/or receive wireless signals.

Chipset 620 connects to display device 640 via interface 626. Display device 640 may be, for example, a liquid crystal display (LCD), a plasma display, cathode ray tube (CRT) display, or any other form of visual display device 640. In some embodiments of the invention, processor 610 and chipset 620 are merged into a single SOC. In addition, chipset 620 connects to one or more buses 650 and 655 that interconnect various elements 674, 660, 662, 664, and 666. Buses 650 and 655 may be interconnected together via a bus bridge 672. In an embodiment, chipset 620 couples with a non-volatile memory 660, a mass storage device(s) 662, a keyboard/mouse 664, and a network interface 666 via interface 624 and/or 626, smart TV 676, consumer electronics 677, etc.

In an embodiment, mass storage device 662 includes, but is not limited to, a solid state drive, a hard disk drive, a universal serial bus flash memory drive, or any other form of computer data storage medium. In an embodiment, network interface 666 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In an embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of cache memory 616) may be incorporated into processing core 612.

The terms and expressions that have been employed are used as terms of description and not of limitation, and there is no intention in the use of such terms and expressions of excluding any equivalents of the features shown and described or portions thereof, but it is recognized that various modifications are possible within the scope of the embodiments of the present disclosure. Thus, it should be understood that although the present disclosure has been specifically disclosed by specific embodiments and optional features, modification and variation of the concepts herein disclosed may be resorted to by those of ordinary skill in the art, and that such modifications and variations are considered to be within the scope of embodiments of the present disclosure.

There are many reasons to use package 10, including the following non-limiting reasons. For example, according to various embodiments, dies 14 and 16 may differ in size with respect to each other. Varying the pitch of bumps 32 and 32 with respect to each other may help to ensure that reliable transmission of signals through bridge die 28 is maintained. Additionally, the reduced size of second interconnect region 43, compared to first interconnect region 41, creates space on die 16 to allow for breakout regions 70 to be located thereon. According to some embodiments, breakout regions 70 may allow for direct routing of signals from die 16, or any other die that breakout region 70 is located on, to be routed directly through bridge die 28 to an external component. According to some embodiments, the presence of breakout region 70 or bumps 76 may allow for testing or debugging signals to be sent directly through bridge die 28.

According to some embodiments, in previous designs bump pitch mismatch between die with a smaller pitch between adjacent bumps results in bumps not related (e.g., differing in pitch) relative to the pitch of the bumps of a bridge die. However, according to some embodiments, syncing the pitch between bumps of first or second dies 14 and 16 with those of bridge die 28 can free up surface area on bridge die 28 that may be utilized to escape signals via on-bridge routing to the surface layer of package 10 to effectively utilize the surface area.

ADDITIONAL EMBODIMENTS

Embodiment 1 provides a semiconductor package comprising:
a first die comprising a first bridge interconnect region;
a second die comprising a second bridge interconnect region;
a bridge die comprising a first contact area to connect to the first bridge interconnect region and a second contact area to connect to the second bridge interconnect region, wherein
the first bridge interconnect region is larger than the second bridge interconnect region;
each of the first bridge interconnect region and the second bridge interconnect region comprise a plurality of conductive bumps; and
an average pitch between adjacent bumps of the first bridge interconnect region is larger than an average pitch between adjacent bumps of the second bridge interconnect region.

Embodiment 2 provides the semiconductor package of Embodiment 1, further comprising a substrate wherein at least one of the first die, the second die, and the bridge die are at least partially embedded therein.

Embodiment 3 provides the semiconductor package of any one of Embodiments 1 or 2, wherein at least one of the first die, the second die, and the bridge die comprise silicon.

Embodiment 4 provides the semiconductor package of any one of Embodiments 1-3, wherein at least one of the first die and the second die are independently chosen from a central processing unit, a flash memory, a Wi-Fi transmitter, and a global positioning system.

Embodiment 5 provides the semiconductor package of any one of Embodiments 1-4, wherein an average pitch between bumps of the first bridge interconnect region is in a range of from about 10 times to about 0.25 times greater than the average pitch between adjacent bumps of the second bridge interconnect region.

Embodiment 6 provides the semiconductor package of any one of Embodiments 1-5, wherein an average pitch between bumps of the first bridge interconnect region is in a range of from about 2 times to about 0.5 times greater than the average pitch between adjacent bumps of the second bridge interconnect region.

Embodiment 7 provides the semiconductor package of any one of Embodiments 1-6, wherein an average pitch between bumps of the first bridge interconnect region is in a range of from about 75 microns to about 150 microns.

Embodiment 8 provides the semiconductor package of any one of Embodiments 1-7, wherein an average pitch between bumps of the first bridge interconnect region is in a range of from about 75 microns to about 130 microns.

Embodiment 9 provides the semiconductor package of any one of Embodiments 1-8, wherein an average pitch between bumps of the second bridge interconnect region is in a range of from about 20 microns to about 70 microns.

Embodiment 10 provides the semiconductor package of any one of Embodiments 1-9, wherein an average pitch between bumps of the second bridge interconnect region is in a range of from about 30 microns to about 65 microns.

Embodiment 11 provides the semiconductor package of any one of Embodiments 1-10, wherein the first die is larger by at least one of surface area and volume than the second die.

Embodiment 12 provides the semiconductor package of any one of Embodiments 1-11, wherein the conductive bumps of at least one of the first bridge interconnect region and the second bridge interconnect region comprise copper.

Embodiment 13 provides the semiconductor package of any one of Embodiments 1-12, wherein the first bridge interconnect region is in a range of from about 10 times to about 0.5 times larger than the second bridge interconnect region.

Embodiment 14 provides the semiconductor package of any one of Embodiments 1-13, wherein the first bridge interconnect region is in a range for from about 5 times to about 2 times larger than the second bridge interconnect region.

Embodiment 15 provides the semiconductor package of any one of Embodiments 1-14, wherein the second die further comprises a first breakout region comprising a plurality of conductive bumps located adjacent the second interconnect region at a first location.

Embodiment 16 provides the semiconductor package of Embodiment 15, wherein the second die further comprises a second breakout region comprising a plurality of conductive bumps located adjacent the second interconnect region at a second location.

Embodiment 17 provides the semiconductor package of any one of Embodiments 15 or 16, wherein at least one of the first breakout region and the second breakout region are at least partially circumscribed by the bridge die.

Embodiment 18 provides the semiconductor package of any one of Embodiments 15-17, further comprising a plurality of at least one of inputs and outputs connected to the conductive bumps of at least one of the first breakout region and the second breakout region.

Embodiment 19 provides the semiconductor package of any one of Embodiments 15-18, wherein a pitch between the adjacent bumps of at least one of the first breakout region and the second breakout region is in a range of from about 10 times to about 0.5 times larger than the pitch of adjacent bumps of the second interconnect region.

Embodiment 20 provides the semiconductor package of any one of Embodiments 15-19, wherein a pitch between the adjacent bumps of at least one of the first breakout region and the second breakout region is in a range of from about 5 times to about 2 times larger than the pitch of adjacent bumps of the second interconnect region.

Embodiment 21 provides the semiconductor package of any one of Embodiments 1-20, further comprising a plurality of conductive bumps located on the bridge die at a location between the first die and the second die.

Embodiment 22 provides the semiconductor package of Embodiment 21, wherein a pitch between adjacent conductive bumps of the bridge may be in a range of from about 1 mm to about 5 mm.

Embodiment 23 provides a semiconductor package comprising:
a first die comprising a first bridge interconnect region;
a second die comprising a second bridge interconnect region;
a bridge die comprising a first contact area to connect to the first bridge interconnect region and a second contact area to connect to the second bridge interconnect region, wherein
the first bridge interconnect region is larger than the second bridge interconnect region;
the first die is larger by at least one of surface area and volume than the second die;
each of the first bridge interconnect region and the second bridge interconnect region comprise a plurality of conductive bumps; and
an average pitch between bumps of the first bridge interconnect region is in a range of from about 10 times to about 0.25 times greater than the average pitch between adjacent bumps of the second bridge interconnect region.

Embodiment 24 provides the semiconductor package of Embodiment 23, further comprising a substrate wherein at least one of the first die, the second die, and the bridge die are at least partially embedded therein.

Embodiment 25 provides the semiconductor package of any one of Embodiments 23 or 24, wherein at least one of the first die, the second die, and the bridge die comprise silicon.

Embodiment 26 provides the semiconductor package of any one of Embodiments 23-25, wherein at least one of the first die and the second die are independently chosen from a central processing unit, a flash memory, a Wi-Fi transmitter, and a global positioning system.

Embodiment 27 provides the semiconductor package of any one of Embodiments 23-26, wherein an average pitch between bumps of the first bridge interconnect region is in a range of from about 2 times to about 0.5 times greater than the average pitch between adjacent bumps of the second bridge interconnect region.

Embodiment 28 provides the semiconductor package of any one of Embodiments 23-27, wherein an average pitch between bumps of the first bridge interconnect region is in a range of from about 75 microns to about 50 microns.

Embodiment 29 provides the semiconductor package of any one of Embodiments 23-28, wherein an average pitch between bumps of the first bridge interconnect region is in a range of from about 75 microns to about 130 microns.

Embodiment 30 provides the semiconductor package of any one of Embodiments 23-29, wherein an average pitch between bumps of the second bridge interconnect region is in a range of from about 20 microns to about 70 microns.

Embodiment 31 provides the semiconductor package of any one of Embodiments 23-30, wherein an average pitch between bumps of the second bridge interconnect region is in a range of from about 30 microns to about 65 microns.

Embodiment 32 provides the semiconductor package of any one of Embodiments 23-31, wherein the conductive bumps of at least one of the first bridge interconnect region and the second bridge interconnect region comprise copper.

Embodiment 33 provides the semiconductor package of any one of Embodiments 23-32, wherein the first bridge interconnect region is in a range of from about 10 times to about 0.5 times larger than the second bridge interconnect region.

Embodiment 34 provides the semiconductor package of any one of Embodiments 23-33, wherein the first bridge interconnect region is in a range for from about 5 times to about 2 times larger than the second bridge interconnect region.

Embodiment 35 provides the semiconductor package of any one of Embodiments 23-34, wherein the second die further comprises a first breakout region comprising a plurality of conductive bumps located adjacent the second interconnect region at a first location.

Embodiment 36 provides the semiconductor package of Embodiment 23, wherein the second die further comprises a second breakout region comprising a plurality of conductive bumps located adjacent the second interconnect region at a second location.

Embodiment 37 provides the semiconductor package of any one of Embodiments 35 or 36, wherein at least one of the first breakout region and the second breakout region are at least partially circumscribed by the bridge die.

Embodiment 38 provides the semiconductor package of any one of Embodiments 35-37, further comprising a plurality of at least one of inputs and outputs connected to the conductive bumps of at least one of the first breakout region and the second breakout region.

Embodiment 39 provides the semiconductor package of any one of Embodiments 35-38, wherein a pitch between the adjacent bumps of at least one of the first breakout region and the second breakout region is in a range of from about 10 times to about 0.5 times larger than the pitch of adjacent bumps of the second interconnect region.

Embodiment 40 provides the semiconductor package of any one of Embodiments 35-39, wherein a pitch between the adjacent bumps of at least one of the first breakout region and the second breakout region is in a range of from about 5 times to about 2 times larger than the pitch of adjacent bumps of the second interconnect region.

Embodiment 41 provides the semiconductor package of any one of Embodiments 23-40, further comprising a plurality of conductive bumps located on the bridge at a location between the first die and the second die.

Embodiment 42 provides the semiconductor package of Embodiment 41, wherein a pitch between adjacent conductive bumps of the bridge may be in a range of from about 1 mm to about 5 mm.

Embodiment 43 provides a method of making a semiconductor package, the method comprising:
connecting a first die to a bridge die along a first bridge interconnect region;
connecting a second die to the bridge die along a second bridge interconnect region; wherein
the first bridge interconnect region is larger than the second bridge interconnect region;
each of the first bridge interconnect region and the second bridge interconnect region comprise a plurality of conductive bumps; and
an average pitch between adjacent bumps of the first bridge interconnect region is larger than an average pitch between adjacent bumps of the second bridge interconnect region.

Embodiment 44 provides the method of Embodiment 43, further comprising at least partially embedding at least one of the first die, the second die, and the bridge die in a substrate.

Embodiment 45 provides the semiconductor package of any one of Embodiments 43 or 44, wherein at least one of the first die, the second die, and the bridge die comprise silicon.

Embodiment 46 provides the semiconductor package of any one of Embodiments 43-45, wherein at least one of the first die and the second die are independently chosen from a central processing unit, a flash memory, a Wi-Fi transmitter, and a global positioning system.

Embodiment 47 provides the semiconductor package of any one of Embodiments 43-46, wherein an average pitch between bumps of the first bridge interconnect region is in a range of from about 10 times to about 0.25 times greater than the average pitch between adjacent bumps of the second bridge interconnect region.

Embodiment 48 provides the semiconductor package of any one of Embodiments 43-47, wherein an average pitch between bumps of the first bridge interconnect region is in a range of from about 2 times to about 0.5 times greater than the average pitch between adjacent bumps of the second bridge interconnect region.

Embodiment 49 provides the semiconductor package of any one of Embodiments 43-48, wherein an average pitch between bumps of the first bridge interconnect region is in a range of from about 75 microns to about 150 microns.

Embodiment 50 provides the semiconductor package of any one of Embodiments 43-49, wherein an average pitch between bumps of the first bridge interconnect region is in a range of from about 75 microns to about 130 microns.

Embodiment 51 provides the semiconductor package of any one of Embodiments 43-50, wherein an average pitch between bumps of the second bridge interconnect region is in a range of from about 20 microns to about 70 microns.

Embodiment 52 provides the semiconductor package of any one of Embodiments 43-51, wherein an average pitch between bumps of the second bridge interconnect region is in a range of from about 30 microns to about 65 microns.

Embodiment 53 provides the semiconductor package of any one of Embodiments 43-52, wherein the first die is larger by at least one of surface area and volume than the second die.

Embodiment 54 provides the semiconductor package of any one of Embodiments 43-53, wherein the conductive bumps of at least one of the first bridge interconnect region and the second bridge interconnect region comprise copper.

Embodiment 55 provides the semiconductor package of any one of Embodiments 43-54, wherein the first bridge interconnect region is in a range of from about 10 times to about 0.5 times larger than the second bridge interconnect region.

Embodiment 56 provides the semiconductor package of any one of Embodiments 43-55, wherein the first bridge interconnect region is in a range for from about 5 times to about 2 times larger than the second bridge interconnect region.

Embodiment 57 provides the semiconductor package of any one of Embodiments 43-56, wherein the second die further comprises a first breakout region comprising a plurality of conductive bumps located adjacent the second interconnect region at a first location.

Embodiment 58 provides the semiconductor package of Embodiment 57, wherein the second die further comprises a second breakout region comprising a plurality of conductive bumps located adjacent the second interconnect region at a second location.

Embodiment 59 provides the semiconductor package of any one of Embodiments 57 or 58, wherein at least one of the first breakout region and the second breakout region are at least partially circumscribed by the bridge die.

Embodiment 60 provides the semiconductor package of any one of Embodiments 57-59, further comprising a plurality of at least one of inputs and outputs connected to the conductive bumps of at least one of the first breakout region and the second breakout region.

Embodiment 61 provides the semiconductor package of any one of Embodiments 57-60, wherein a pitch between the adjacent bumps of at least one of the first breakout region and the second breakout region is in a range of from about 10 times to about 0.5 times larger than the pitch of adjacent bumps of the second interconnect region.

Embodiment 62 provides the semiconductor package of any one of Embodiments 57-61, wherein a pitch between the adjacent bumps of at least one of the first breakout region and the second breakout region is in a range of from about 5 times to about 2 times larger than the pitch of adjacent bumps of the second interconnect region.

Embodiment 63 provides the semiconductor package of any one of Embodiments 43-62, further comprising a plurality of conductive bumps located on the bridge at a location between the first die and the second die.

Embodiment 64 provides the semiconductor package of Embodiment 63, wherein a pitch between adjacent conductive bumps of the bridge may be in a range of from about 1 mm to about 5 mm.

What is claimed is:

1. A semiconductor package comprising:
a first die comprising a first interconnect and a second interconnect having a first pitch, the first die having a footprint;
a second die comprising a third interconnect and a fourth interconnect having a second pitch smaller than the first pitch, the second die having a footprint;
a bridge die comprising a first contact area to connect to the first die and a second contact area to connect to the second die, the bridge die comprising a plurality of interconnect layers, wherein the first interconnect and the second interconnect of the first die are connected to the third interconnect and the fourth interconnect of the second die by the plurality of interconnect layers, wherein the bridge die has a footprint that overlaps with the footprint of the first die and the footprint of the second die, and wherein the first die extends laterally beyond the bridge die, and the second die extends laterally beyond the bridge die.

2. The semiconductor package of claim 1, wherein the bridge die comprises silicon.

3. The semiconductor package of claim 1, wherein the first pitch is in a range of from about 10 times to about 0.25 times greater than the second pitch.

4. The semiconductor package of claim 1, wherein the first pitch is in a range of from about 75 microns to about 150 microns.

5. The semiconductor package of claim 1, wherein the second pitch is in a range of from about 20 microns to about 70 microns.

6. The semiconductor package of claim 1, wherein the first die is larger by at least one of surface area and volume than the second die.

7. The semiconductor package of claim 1, wherein the first die or the second die is a central processing unit.

8. The semiconductor package of claim 1, wherein the first die or the second die comprises flash memory.

9. The semiconductor package of claim 1, wherein the first die or the second die comprises a Wi-Fi transmitter.

10. The semiconductor package of claim 1, wherein the first die or the second die is a global positioning system.

11. A method of making a semiconductor package, the method comprising:
connecting a first die to a bridge die, the first die comprising a first interconnect and a second interconnect having a first pitch, and the first die having a footprint; and
connecting a second die to the bridge die, the second die comprising a third interconnect and a fourth interconnect having a second pitch smaller than the first pitch, and the second die having a footprint, wherein the bridge die comprises a plurality of interconnect layers, and wherein the first interconnect and the second interconnect of the first die are connected to the third interconnect and the fourth interconnect of the second die by the plurality of interconnect layers, wherein the bridge die has a footprint that overlaps with the footprint of the first die and the footprint of the second die, wherein the first die extends laterally beyond the bridge die, and wherein the second die extends laterally beyond the bridge die.

12. The method of claim 11, wherein the bridge die comprises silicon.

13. The method of claim 11, wherein the first pitch is in a range of from about 10 times to about 0.25 times greater than the second pitch.

14. The method of claim 11, wherein the first pitch is in a range of from about 75 microns to about 150 microns.

15. The method of claim 11, wherein the second pitch is in a range of from about 20 microns to about 70 microns.

16. The method of claim 11, wherein the first die is larger by at least one of surface area and volume than the second die.

17. The method of claim 11, wherein the first die or the second die is a central processing unit.

18. The method of claim 11, wherein the first die or the second die comprises flash memory.

19. The method of claim 11, wherein the first die or the second die comprises a Wi-Fi transmitter.

20. The method of claim 11, wherein the first die or the second die is a global positioning system.

* * * * *